(12) United States Patent
Kim et al.

(10) Patent No.: US 12,062,334 B2
(45) Date of Patent: Aug. 13, 2024

(54) PIXEL AND DISPLAY DEVICE INCLUDING THE SAME

(71) Applicant: Samsung Display Co., Ltd., Yongin-Si (KR)

(72) Inventors: Hanbit Kim, Seoul (KR); Sungwook Kim, Suwon-si (KR); Chanyeob Seol, Suwon-si (KR); Yunjung Oh, Anyang-si (KR); Jeong-Soo Lee, Seoul (KR); Jina Lee, Seongnam-si (KR); Seongbaik Chu, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/139,975

(22) Filed: Apr. 27, 2023

(65) Prior Publication Data

US 2024/0078973 A1   Mar. 7, 2024

(30) Foreign Application Priority Data

Jun. 28, 2022   (KR) .......................... 10-2022-0079207

(51) Int. Cl.
*G09G 3/3233*   (2016.01)
*H10K 59/131*   (2023.01)

(52) U.S. Cl.
CPC ......... *G09G 3/3233* (2013.01); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/0247* (2013.01)

(58) Field of Classification Search
CPC .......................... G09G 3/3233; H10K 59/131
See application file for complete search history.

(56) References Cited

U.S. PATENT DOCUMENTS 10,872,945 B2 * 12/2020  Choi ................... H10K 59/1213
11,798,474 B2 * 10/2023  Wang ................... G09G 3/3233

FOREIGN PATENT DOCUMENTS

KR   10-0749872 B1   8/2007

\* cited by examiner

*Primary Examiner* — Sardis F Azongha
(74) *Attorney, Agent, or Firm* — Innovation Counsel LLP

(57) ABSTRACT

A pixel may include a light emitting diode which includes an anode and a cathode, a first transistor which includes a first source region, a first drain region electrically connected to the anode, a first channel region, and a first gate electrode, a first sub-transistor which includes a first sub-source region connected to the first drain region, a first sub-drain region, a first sub-channel region, and a first sub-gate electrode, a second sub-transistor which includes a second sub-source region connected to the first sub-drain region, a second sub-drain region connected to the first gate electrode, a second sub-channel region, and a second sub-gate electrode, a storage line which overlaps the first sub-drain region and the second sub-source region, and a first hold pattern which overlaps the first sub-drain region, the second sub-source region, and the storage line, and connected to the first sub-drain region and the second sub-source region.

20 Claims, 14 Drawing Sheets

CHD1:CHD1-1,CHD1-2

PIXEL AND DISPLAY DEVICE INCLUDING THE SAME

CROSS-REFERENCE TO RELATED APPLICATION(S)

This application claims priority under 35 USC § 119 to Korean Patent Application No. 10-2022-0079207 filed on Jun. 28, 2022, in the Korean Intellectual Property Office (KIPO), the entire disclosure of which is incorporated by reference herein.

BACKGROUND

1. Field

Embodiments relate to a display device. More particularly, embodiments relate to a pixel and a display device including the pixel and applied to various electronic apparatuses.

2. Description of the Related Art

A display device may include a plurality of pixels. Each of the pixels may include a light emitting diode emitting light and a pixel circuit controlling light emission of the light emitting diode.

The pixel circuit may include a plurality of transistors and at least one capacitor. The transistors may include a driving transistor and at least one switching transistor. In order to reduce a leakage current of the switching transistor, the switching transistor may have a dual gate structure.

SUMMARY

Embodiments provide a pixel having improved display quality and a display device including the pixel.

A pixel according to embodiments may include a light emitting diode which includes an anode and a cathode, a first transistor which includes a first source region electrically connected to a driving voltage line that transmits a driving voltage, a first drain region electrically connected to the anode, a first channel region disposed between the first source region and the first drain region, and a first gate electrode overlapping the first channel region, a first sub-transistor which includes a first sub-source region connected to the first drain region, a first sub-drain region, a first sub-channel region disposed between the first sub-source region and the first sub-drain region, and a first sub-gate electrode overlapping the first sub-channel region, a second sub-transistor which includes a second sub-source region connected to the first sub-drain region, a second sub-drain region connected to the first gate electrode, a second sub-channel region disposed between the second sub-source region and the second sub-drain region, and a second sub-gate electrode overlapping the second sub-channel region, a storage line which overlaps the first sub-drain region and the second sub-source region in a plan view, and a first hold pattern which overlaps the first sub-drain region, the second sub-source region, and the storage line in the plan view, and connected to the first sub-drain region and the second sub-source region.

In an embodiment, the pixel may further include a connection pattern which connects the first gate electrode and the second sub-drain region, and disposed in a different layer from the first gate electrode.

In an embodiment, the first hold pattern may be disposed in the same layer as the connection pattern.

In an embodiment, the storage line may be disposed in a different layer from the first gate electrode and overlaps the first gate electrode in the plan view.

In an embodiment, the storage line may receive the driving voltage.

In an embodiment, the storage line may be disposed on the first sub-drain region and the second sub-source region. The first hold pattern may be disposed on the storage line.

In an embodiment, the first hold pattern may contact the first sub-drain region and the second sub-source region through a contact hole defined in an insulation layer disposed between the first sub-drain region and the first hold pattern and between the second sub-source region and the first hold pattern.

In an embodiment, an opening may be defined in the storage line. The contact hole may be positioned in the opening in the plan view.

In an embodiment, the pixel may further include a third sub-transistor which includes a third sub-source region electrically connected to an initialization voltage line that transmits an initialization voltage, a third sub-drain region, a third sub-channel region disposed between the third sub-source region and the third sub-drain region, and a third sub-gate electrode overlapping the third sub-channel region, a fourth sub-transistor which includes a fourth sub-source region connected to the third sub-drain region, a fourth sub-drain region connected to the first gate electrode, a fourth sub-channel region disposed between the fourth sub-source region and the fourth sub-drain region, and a fourth sub-gate electrode overlapping the fourth sub-channel region, and a second hold pattern which overlaps the third sub-drain region and the fourth sub-source region in the plan view, and connected to the third sub-drain region and the fourth sub-source region. The storage line may overlap the third sub-drain region, the fourth sub-source region, and the second hold pattern in the plan view.

In an embodiment, the second hold pattern may be disposed in the same layer as the first hold pattern.

A pixel according to embodiments may include a light emitting diode which includes an anode and a cathode, a first transistor which includes a first source region electrically connected to a driving voltage line that transmits a driving voltage, a first drain region electrically connected to the anode, a first channel region disposed between the first source region and the first drain region, and a first gate electrode overlapping the first channel region, a third sub-transistor which includes a third sub-source region electrically connected to an initialization voltage line that transmits an initialization voltage, a third sub-drain region, a third sub-channel region disposed between the third sub-source region and the third sub-drain region, and a third sub-gate electrode overlapping the third sub-channel region, a fourth sub-transistor which includes a fourth sub-source region connected to the third sub-drain region, a fourth sub-drain region connected to the first gate electrode, a fourth sub-channel region disposed between the fourth sub-source region and the fourth sub-drain region, and a fourth sub-gate electrode overlapping the fourth sub-channel region, a storage line which overlaps the third sub-drain region and the fourth sub-source region in a plan view, and a second hold pattern which overlaps the third sub-drain region, the fourth sub-source region, and the storage line in the plan view, and connected to the third sub-drain region and the fourth sub-source region.

In an embodiment, the second hold pattern may be disposed in the same layer as the initialization voltage line.

In an embodiment, the storage line may be disposed in a different layer from the first gate electrode and overlaps the first gate electrode in the plan view.

In an embodiment, the storage line may receive the driving voltage.

In an embodiment, the storage line may be disposed on the third sub-drain region and the fourth sub-source region. The second hold pattern may be disposed on the storage line.

In an embodiment, the second hold pattern may contact the third sub-drain region and the fourth sub-source region through a contact hole defined in an insulation layer disposed between the third sub-drain region and the second hold pattern and between the fourth sub-source region and the second hold pattern.

In an embodiment, an opening may be defined in the storage line. The contact hole may be positioned in the opening in the plan view.

A display device according to embodiments may include a pixel which includes a light emitting diode including an anode and a cathode, and a pixel circuit providing a driving current to the light emitting diode, a gate driver providing a gate signal to the pixel, a data driver providing a data signal to the pixel, and an emission control driver providing an emission control signal to the pixel. The pixel circuit may include a first transistor which includes a first source region electrically connected to a driving voltage line that transmits a driving voltage, a first drain region electrically connected to the anode, a first channel region disposed between the first source region and the first drain region, and a first gate electrode overlapping the first channel region, a first sub-transistor which includes a first sub-source region connected to the first drain region, a first sub-drain region, a first sub-channel region disposed between the first sub-source region and the first sub-drain region, and a first sub-gate electrode overlapping the first sub-channel region, a second sub-transistor which includes a second sub-source region connected to the first sub-drain region, a second sub-drain region connected to the first gate electrode, a second sub-channel region disposed between the second sub-source region and the second sub-drain region, and a second sub-gate electrode overlapping the second sub-channel region, a storage line which overlaps the first sub-drain region and the second sub-source region in a plan view, and a first hold pattern which overlaps the first sub-drain region, the second sub-source region, and the storage line in the plan view, and connected to the first sub-drain region and the second sub-source region.

In an embodiment, the pixel circuit may further include a third sub-transistor which includes a third sub-source region electrically connected to an initialization voltage line that transmits an initialization voltage, a third sub-drain region, a third sub-channel region disposed between the third sub-source region and the third sub-drain region, and a third sub-gate electrode overlapping the third sub-channel region, a fourth sub-transistor which includes a fourth sub-source region connected to the third sub-drain region, a fourth sub-drain region connected to the first gate electrode, a fourth sub-channel region disposed between the fourth sub-source region and the fourth sub-drain region, and a fourth sub-gate electrode overlapping the fourth sub-channel region, and a second hold pattern which overlaps the third sub-drain region and the fourth sub-source region in the plan view, and connected to the third sub-drain region and the fourth sub-source region. The storage line may overlap the third sub-drain region, the fourth sub-source region, and the second hold pattern in the plan view.

In an embodiment, the second hold pattern may be disposed in the same layer as the first hold pattern.

In the pixel and the display device including the pixel according to the embodiments, a capacitance between an intermediate node of a transistor having a dual gate structure and the storage line may increase, so that a leakage current through the transistor may be reduced. Accordingly, display quality of the display device may be improved.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
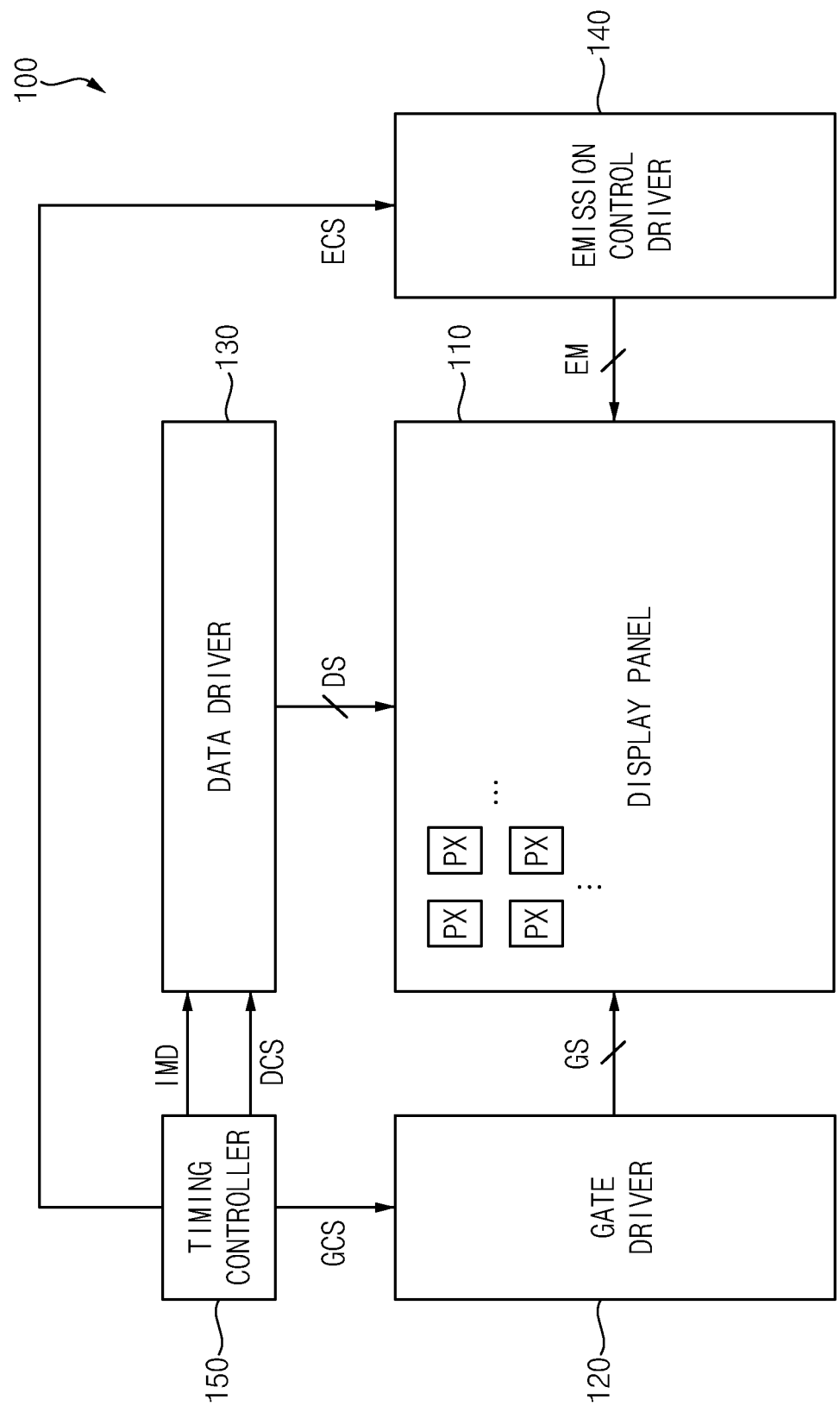
FIG. 1 is a block diagram illustrating a display device according to an embodiment.

Hereinafter, a display device and a pixel according to embodiments of the present disclosure will be described in more detail with reference to the accompanying drawings. The same or similar reference numerals will be used for the same elements in the accompanying drawings.

FIG. 1 is a block diagram illustrating a display device 100 according to an embodiment.

Referring to FIG. 1, a display device 100 may include a display panel 110, a gate driver 120, a data driver 130, an emission control driver 140, and a timing controller 150.

The display panel 110 may include a plurality of pixels PX. In an embodiment, the plurality of pixels PX may include red pixels emitting red light, green pixels emitting green light, and blue pixels emitting blue light.

The gate driver 120 may provide a gate signal GS to each of the pixels PX. The gate driver 120 may generate the gate signal GS, which includes a first gate signal GW, a second gate signal GC, a third gate signal GI, and a fourth gate signal GB, based on a first control signal GCS. The first control signal GCS may include a gate start signal, a gate clock signal, or the like.

The data driver 130 may provide a data signal DS to each of the pixels PX. The data driver 130 may generate the data signal DS based on image data IMD and a second control signal DCS. The image data IMD may include grayscale values corresponding to the pixels PX. The second control signal DCS may include a data start signal, a data clock signal, or the like.

The emission control driver 140 may provide an emission control signal EM to each of the pixels PX. The emission control driver 140 may generate the emission control signal EM based on a third control signal ECS. The third control signal ECS may include an emission control start signal, an emission control clock signal, or the like.

The timing controller 150 may control the operation of the gate driver 120, the operation of the data driver 130, and the operation of the emission control driver 140. The timing controller 150 may generate the image data IMD, the first control signal GCS, the second control signal DCS, and the third control signal ECS based on an image signal and a control signal received from the outside.

Figure 2:
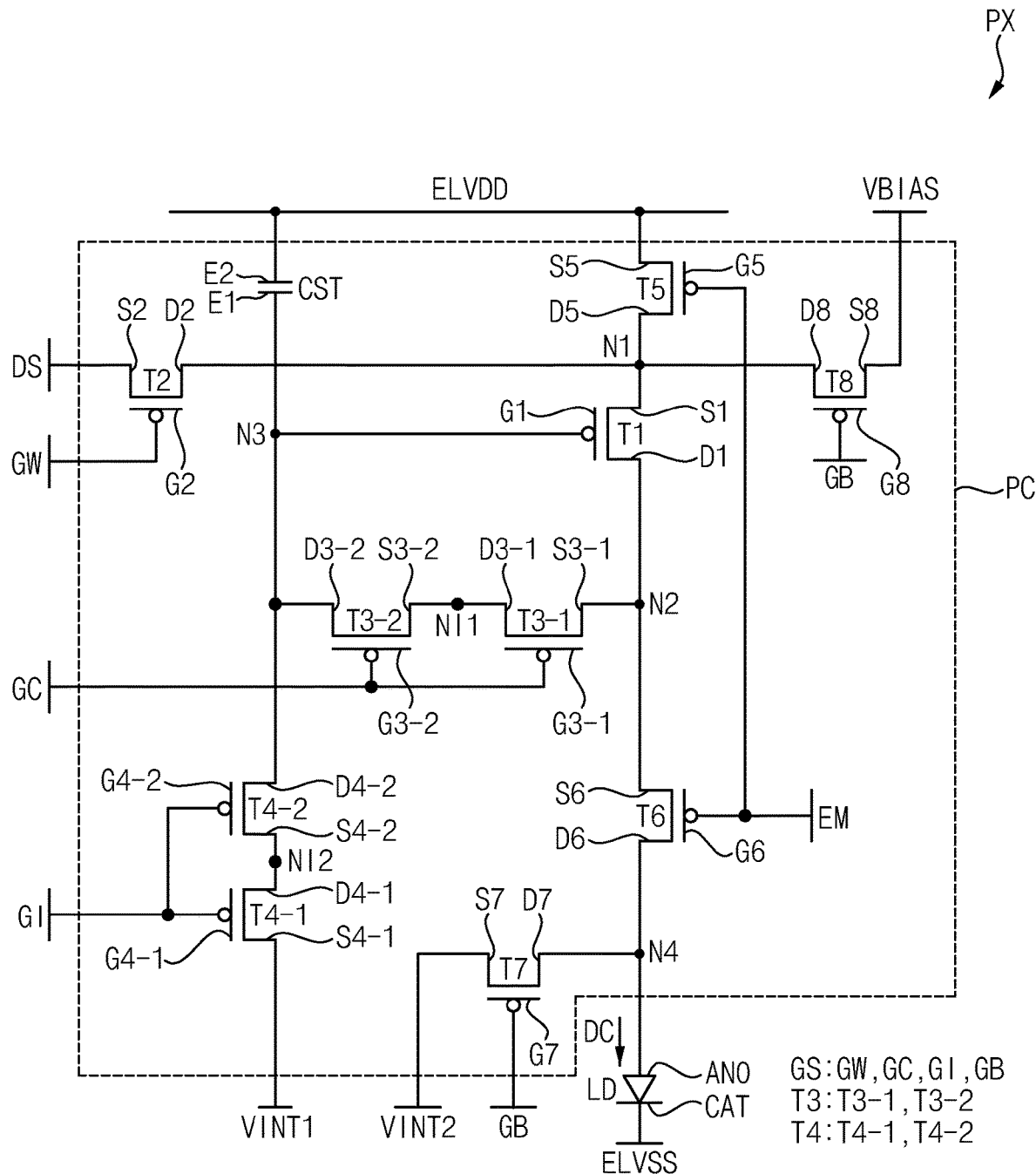
FIG. 2 is a circuit diagram illustrating a pixel included in the display device in FIG. 1.

FIG. 2 is a circuit diagram illustrating the pixel PX included in the display device 100 in FIG. 1.

Referring to FIG. 2, the pixel PX may include a light emitting diode LD and a pixel circuit PC.

The light emitting diode LD may emit light based on a driving current DC. The light emitting diode LD may emit light having a luminance corresponding to the driving current DC. The light emitting diode LD may include an anode ANO and a cathode CAT. The anode ANO may be connected to the pixel circuit PC. The cathode CAT may be connected to a common voltage line that transmits a common voltage ELVSS.

The pixel circuit PC may control light emission of the light emitting diode LD. The pixel circuit PC may provide the driving current DC to the light emitting diode LD. The pixel circuit PC may include a plurality of transistors and at least one capacitor. In an embodiment, the pixel circuit PC may include a first transistor T1, a second transistor T2, a third transistor T3, a fourth transistor T4, a fifth transistor T5, a sixth transistor T6, a seventh transistor T7, an eighth transistor T8, and a storage capacitor CST.

The first transistor T1 may include a first source electrode S1, a first drain electrode D1, and a first gate electrode G1. The first source electrode S1 may be connected to a first node N1. The first drain electrode D1 may be connected to a second node N2. The first gate electrode G1 may be connected to a third node N3. The first transistor T1 may generate the driving current DC based on a voltage between the third node N3 and the first node N1.

The second transistor T2 may include a second source electrode S2, a second drain electrode D2, and a second gate electrode G2. The second source electrode S2 may be connected to a data line that transmits the data signal DS. The second drain electrode D2 may be connected to the first node N1. The second gate electrode G2 may be connected to a first gate line that transmits the first gate signal GW. The second transistor T2 may write the data signal DS to the first node N1 in response to the first gate signal GW.

The third transistor T3 may include a first sub-transistor T3-1 and a second sub-transistor T3-2. The third transistor T3 may have a dual gate structure including two gate electrodes. The first sub-transistor T3-1 may include a first sub-source electrode S3-1, a first sub-drain electrode D3-1, and a first sub-gate electrode G3-1. The first sub-source electrode S3-1 may be connected to the second node N2. The first sub-drain electrode D3-1 may be connected to a first intermediate node NI1 disposed between the first sub-transistor T3-1 and the second sub-transistor T3-2. The first sub-gate electrode G3-1 may be connected to a second gate line that transmits the second gate signal GC. The second sub-transistor T3-2 may include a second sub-source electrode S3-2, a second sub-drain electrode D3-2, and a second sub-gate electrode G3-2. The second sub-source electrode S3-2 may be connected to the first intermediate node NI1. The second sub-drain electrode D3-2 may be connected to the third node N3. The second sub-gate electrode G3-2 may be connected to the second gate line. The third transistor T3 may diode-connect the first drain electrode D1 and the first gate electrode G1 of the first transistor T1 in response to the second gate signal GC.

The fourth transistor T4 may include a third sub-transistor T4-1 and a fourth sub-transistor T4-2. The fourth transistor T4 may have a dual gate structure including two gate electrodes. The third sub-transistor T4-1 may include a third sub-source electrode S4-1, a third sub-drain electrode D4-1, and a third sub-gate electrode G4-1. The third sub-source electrode S4-1 may be connected to a first initialization voltage line that transmits a first initialization voltage VINT1. The third sub-drain electrode D4-1 may be connected to a second intermediate node NI2 disposed between the third sub-transistor T4-1 and the fourth sub-transistor T4-2. The third sub-gate electrode G4-1 may be connected to a third gate line that transmits the third gate signal GI. The fourth sub-transistor T4-2 may include a fourth sub-source electrode S4-2, a fourth sub-drain electrode D4-2, and a fourth sub-gate electrode G4-2. The fourth sub-source electrode S4-2 may be connected to the second intermediate node NI2. The fourth sub-drain electrode D4-2 may be connected to the third node N3. The fourth sub-gate electrode G4-2 may be connected to the third gate line. The fourth transistor T4 may initialize the first gate electrode G1 of the first transistor T1 with the first initialization voltage VINT1 in response to the third gate signal GI.

The fifth transistor T5 may include a fifth source electrode S5, a fifth drain electrode D5, and a fifth gate electrode G5. The fifth source electrode S5 may be connected to a driving voltage line that transmits a driving voltage ELVDD. In an embodiment, the driving voltage ELVDD may be higher than the common voltage ELVSS. The fifth drain electrode D5 may be connected to the first node N1. The fifth gate electrode G5 may be connected to an emission control line that transmits the emission control signal EM. The fifth transistor T5 may electrically connect the driving voltage line to the first node N1 in response to the emission control signal EM.

The sixth transistor T6 may include a sixth source electrode S6, a sixth drain electrode D6, and a sixth gate electrode G6. The sixth source electrode S6 may be connected to the second node N2. The sixth drain electrode D6 may be connected to a fourth node N4. The sixth gate electrode G6 may be connected to the emission control line. The sixth transistor T6 may electrically connect the second node N2 to the anode ANO of the light emitting diode LD in response to the emission control signal EM.

The seventh transistor T7 may include a seventh source electrode S7, a seventh drain electrode D7, and a seventh gate electrode G7. The seventh source electrode S7 may be connected to a second initialization voltage line that transmits a second initialization voltage VINT2. The seventh drain electrode D7 may be connected to the fourth node N4. The seventh gate electrode G7 may be connected to a fourth gate line that transmits the fourth gate signal GB. The seventh transistor T7 may initialize the anode ANO of the light emitting diode LD with the second initialization voltage VINT2 in response to the fourth gate signal GB.

The eighth transistor T8 may include an eighth source electrode S8, an eighth drain electrode D8, and an eighth gate electrode G8. The eighth source electrode S8 may be connected to a bias voltage line that transmits a bias voltage VBIAS. The eighth drain electrode D8 may be connected to the first node N1. The eighth gate electrode G8 may be connected to the fourth gate line. The eighth transistor T8 may on-bias the first transistor T1 with the bias voltage VBIAS in response to the fourth gate signal GB.

In an embodiment, each of the first transistor T1, the second transistor T2, the third transistor T3, the fourth transistor T4, the fifth transistor T5, the sixth transistor T6, the seventh transistor T7, and the eighth transistor T8 may be a P-type transistor (e.g., a PMOS transistor). In another embodiment, at least one of the first transistor T1, the second transistor T2, the third transistor T3, the fourth transistor T4, the fifth transistor T5, the sixth transistor T6, the seventh transistor T7, and the eighth transistor T8 may be an N-type transistor (e.g., an NMOS transistor).

The storage capacitor CST may include a first electrode E1 and a second electrode E2. The first electrode E1 may be connected to the third node N3. The second electrode E2 may be connected to the driving voltage line. The storage capacitor CST may store the voltage of the first gate electrode G1 of the first transistor T1.

Figure 3:
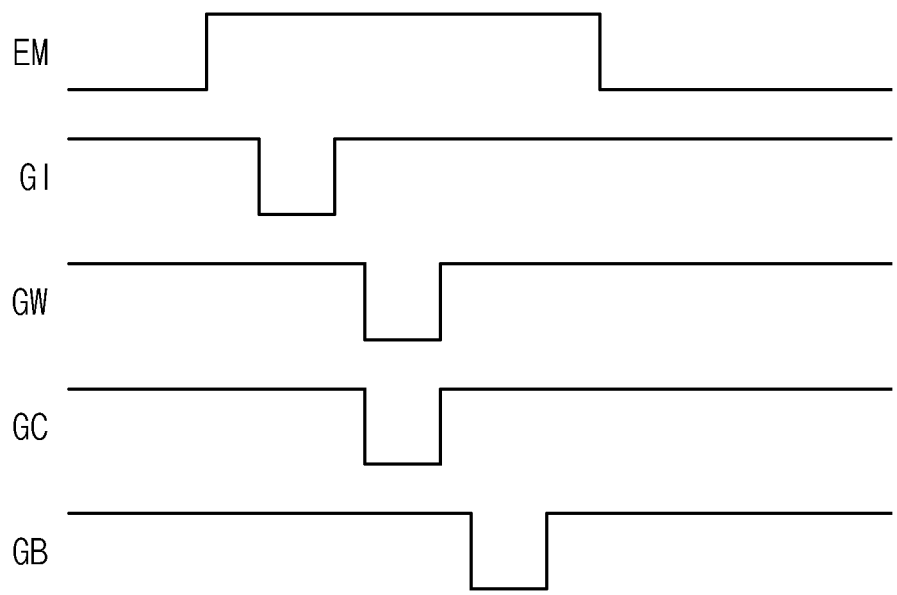
FIG. 3 is a timing diagram for describing an operation of the pixel in FIG. 2.

FIG. 3 is a timing diagram for describing an operation of the pixel PX in FIG. 2.

Referring to FIG. 3, the fourth transistor T4 may be turned on in response to a gate-on voltage (a logical low voltage) of the third gate signal GI, and the first gate electrode G1 of the first transistor T1 may be initialized by the first initialization voltage VINT1.

Then, the third transistor T3 may be turned on in response to the gate-on voltage (the logic low voltage) of the second gate signal GC, and the first drain electrode D1 and the first gate electrode G1 of the first transistor T1 may be diode-connected. Further, the second transistor T2 may be turned on in response to the gate-on voltage (the logic low voltage) of the first gate signal GW, and the data signal DS may be written in the first gate electrode G1 of the first transistor T1.

Then, the seventh transistor T7 may be turned on in response to the gate-on voltage (the logic low voltage) of the fourth gate signal GB, and the anode ANO of the light emitting diode LD may be initialized by the second initialization voltage VINT2. Further, the eighth transistor T8 may be turned on in response to the gate-on voltage of the fourth gate signal GB, and the bias voltage VBIAS may be applied to the first source electrode S1 of the first transistor T1. Accordingly, the first transistor T1 may be on-biased.

Then, the fifth transistor T5 and the sixth transistor T6 may be turned on in response to the gate-on voltage (the logic low voltage) of the emission control signal EM, and the driving current DC corresponding to the voltage between first gate electrode G1 and the first source electrode S1 of the first transistor T1 may flow through the light emitting diode LD. Accordingly, the light emitting diode LD may emit light having a luminance corresponding to the driving current DC.

Figure 4:
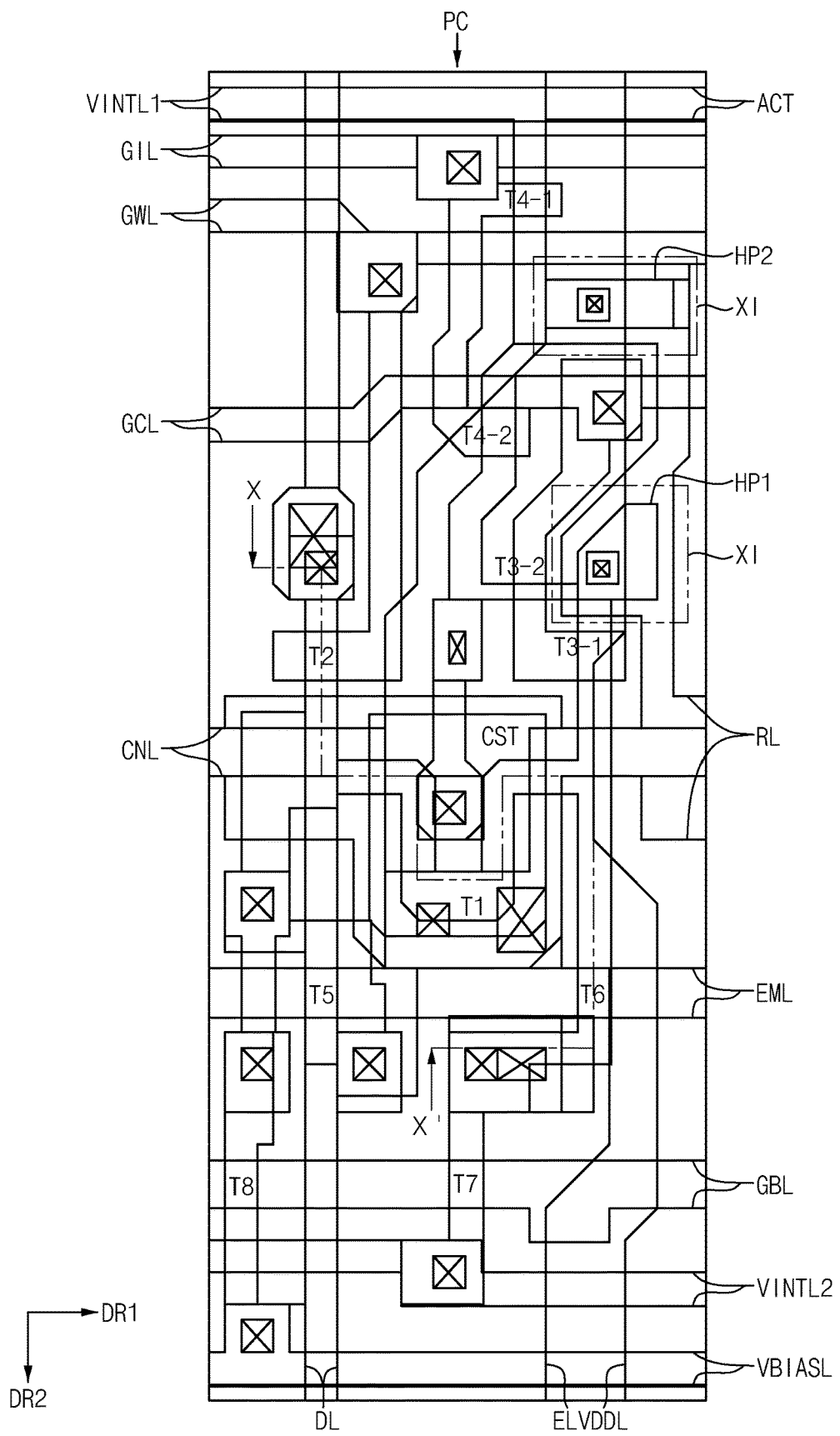
FIG. 4 is a plan view illustrating a pixel circuit included in the pixel in FIG. 2.
Figure 5:
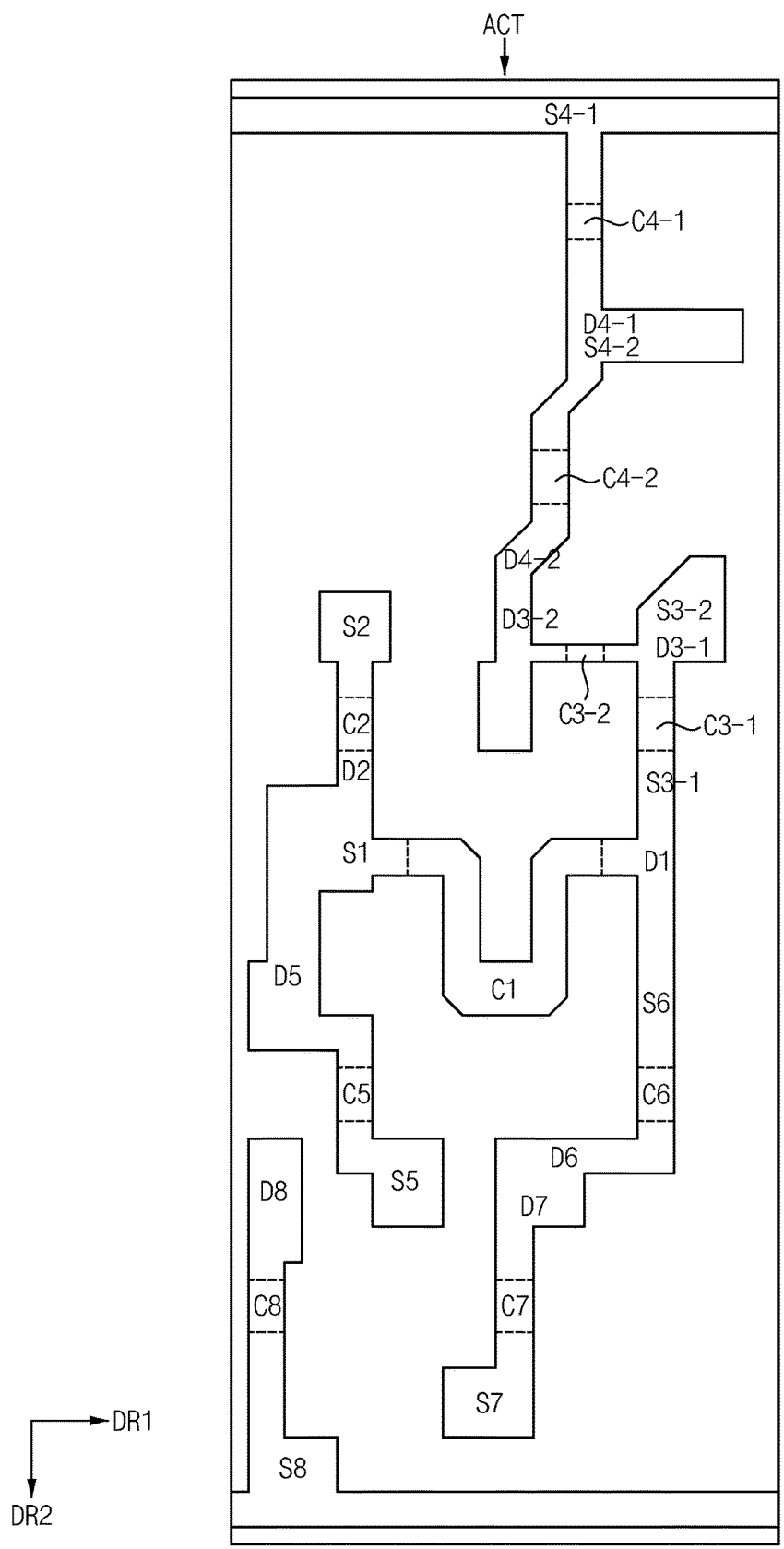
FIG. 5 is a plan view illustrating an active layer included in the pixel circuit in FIG. 4.
Figure 6:
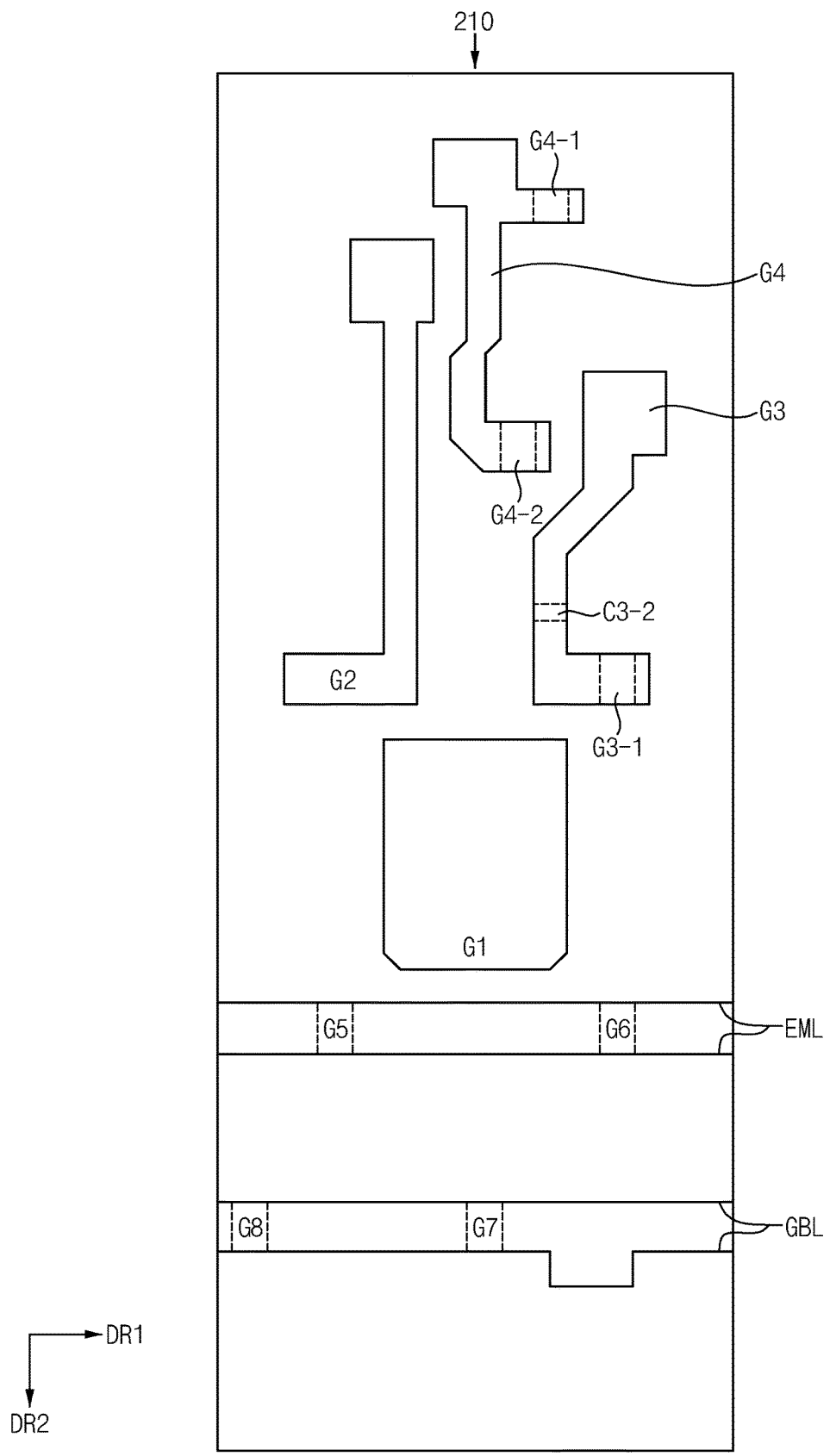
FIG. 6 is a plan view illustrating a first conductive layer included in the pixel circuit in FIG. 4.
Figure 7:
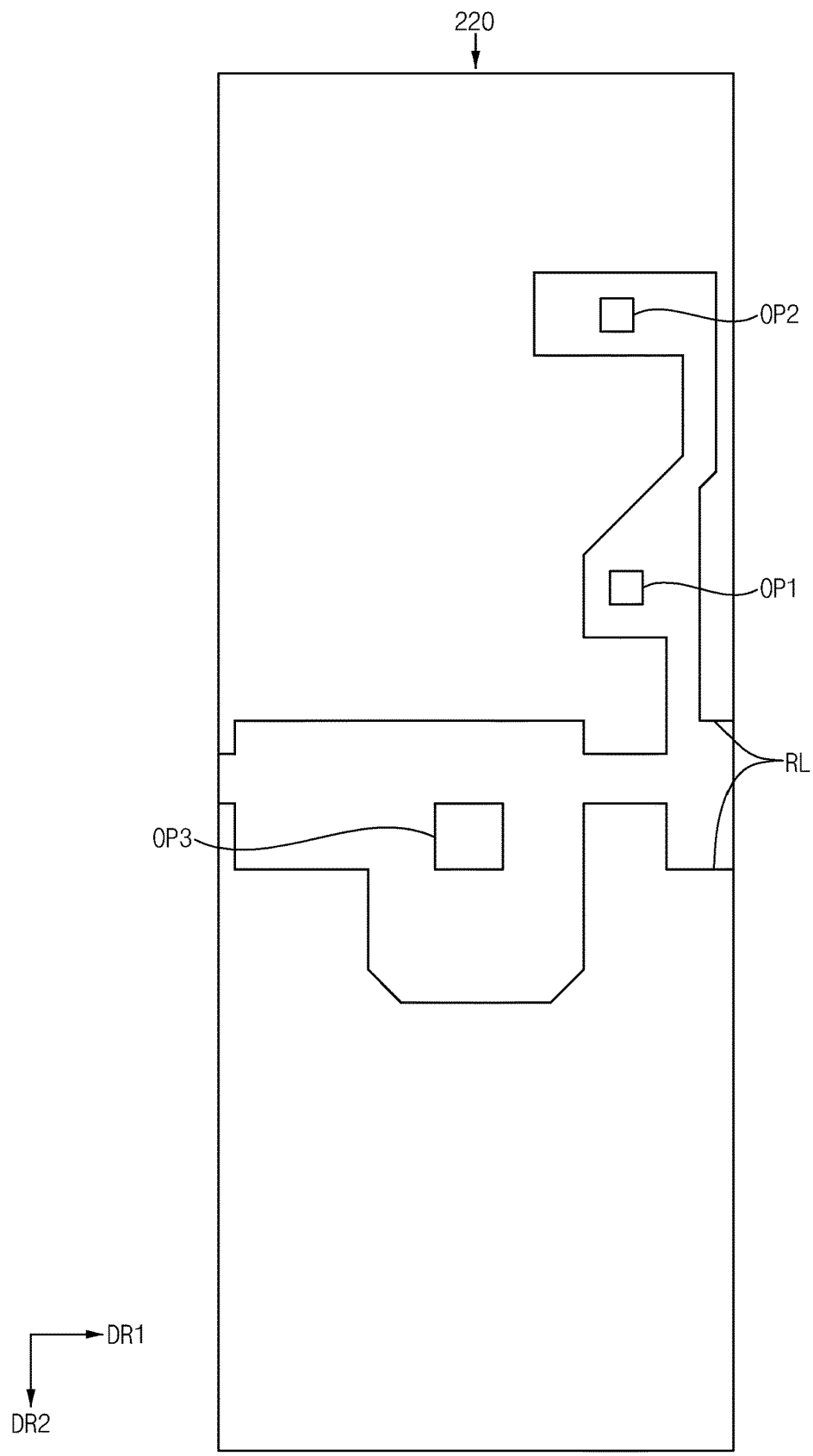
FIG. 7 is a plan view illustrating a second conductive layer included in the pixel circuit in FIG. 4.
Figure 8:
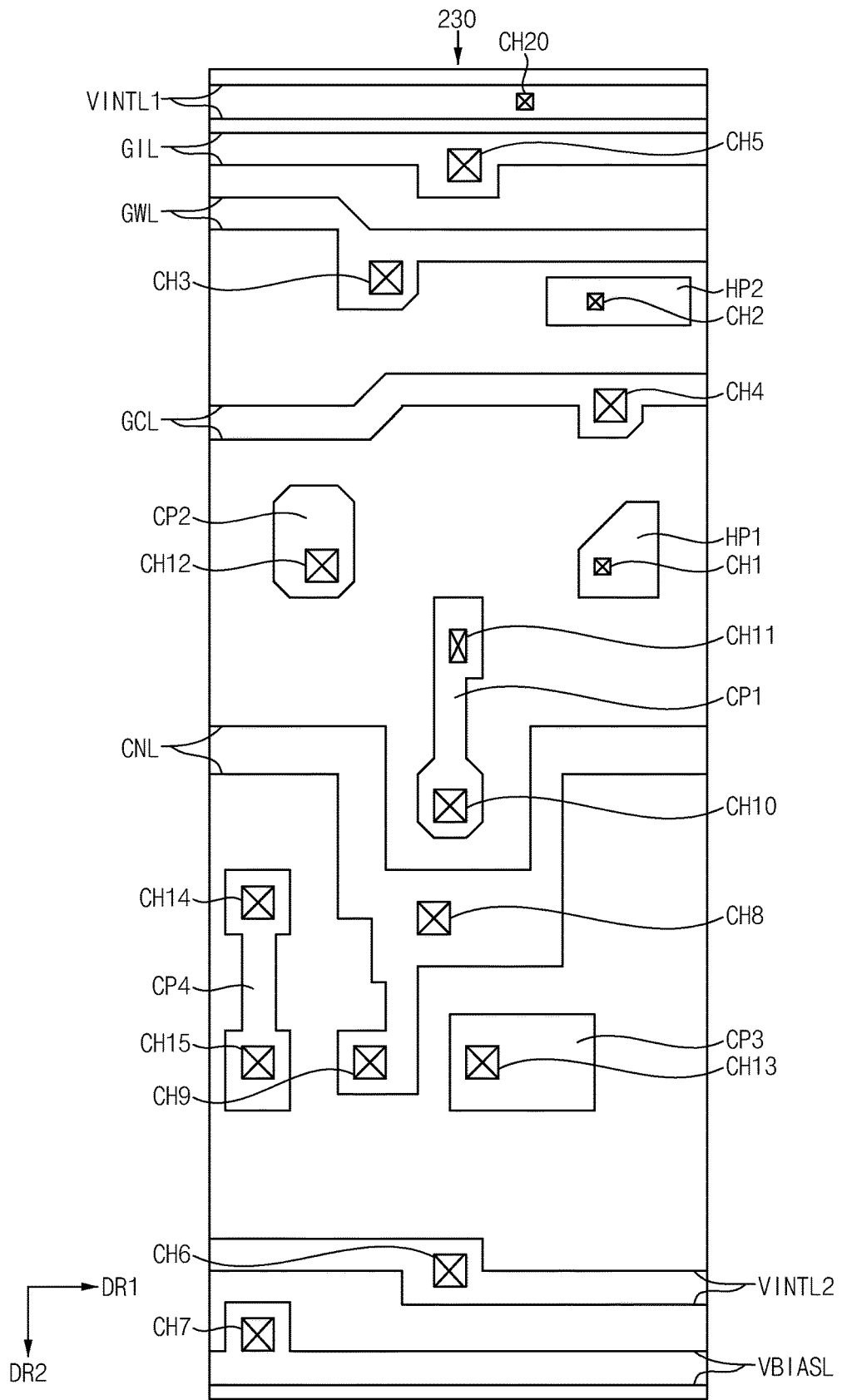
FIG. 8 is a plan view illustrating a third conductive layer included in the pixel circuit in FIG. 4.
Figure 9:
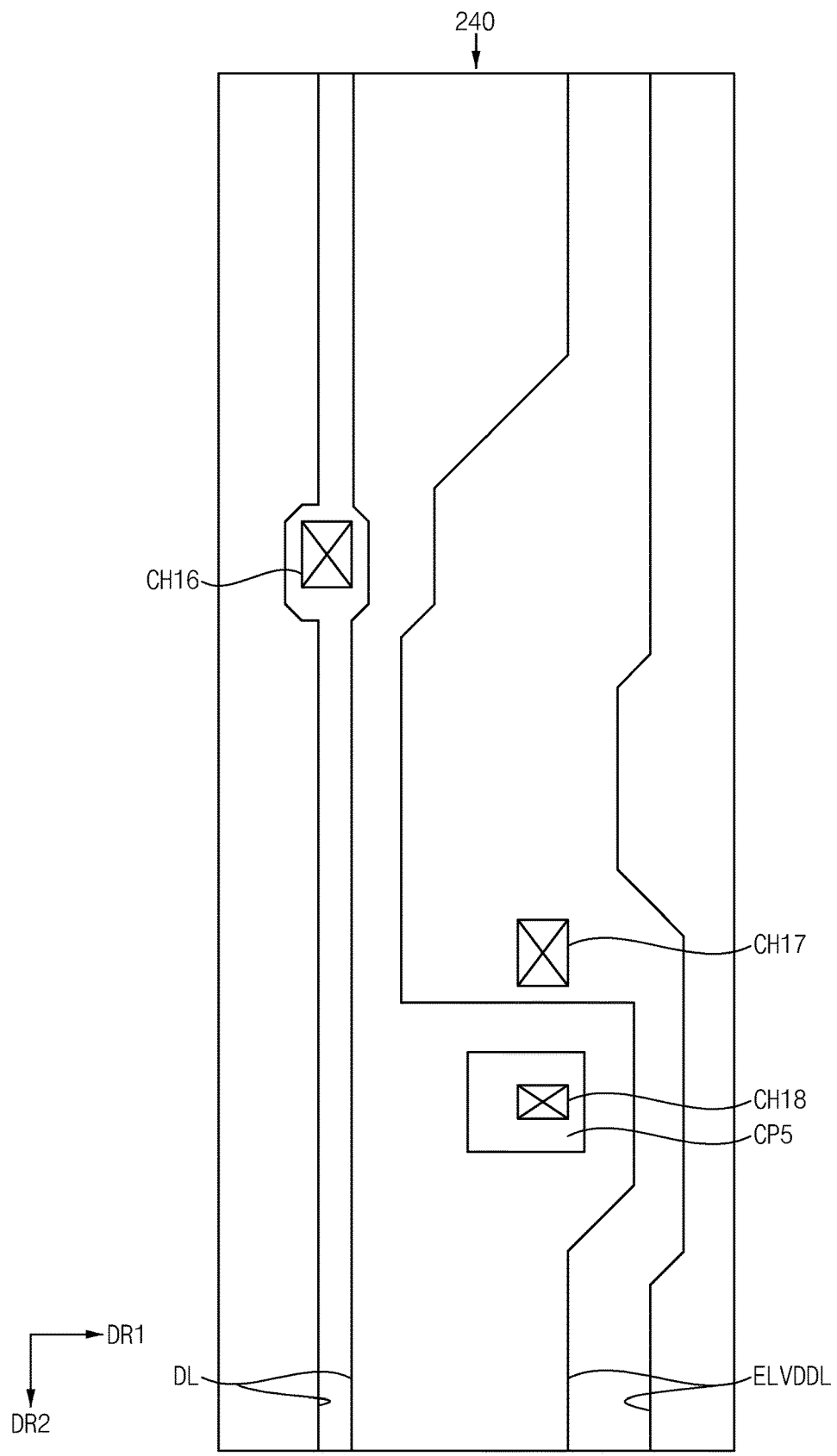
FIG. 9 is a plan view illustrating a fourth conductive layer included in the pixel circuit in FIG. 4.
Figure 10:
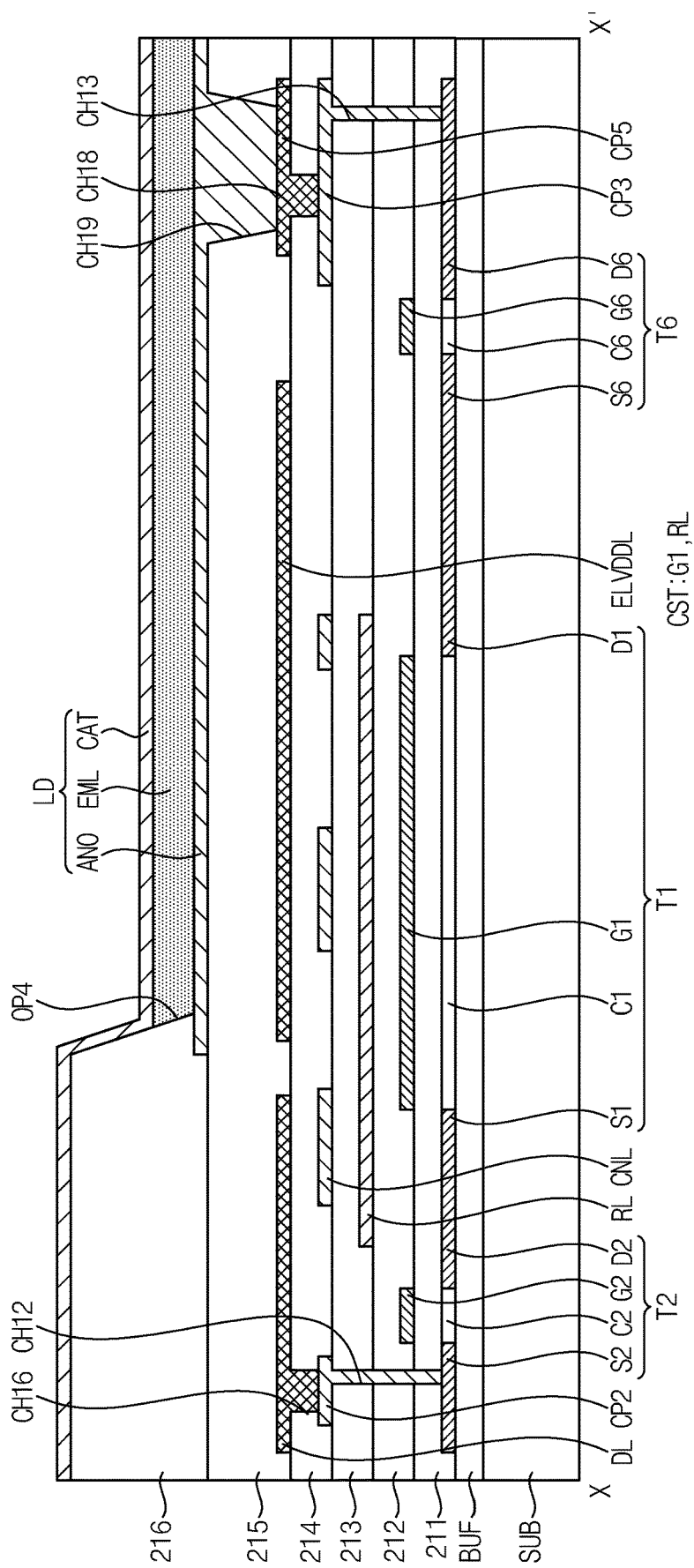
FIG. 10 is a cross-sectional view taken along a line X-X' in FIG. 4.

FIG. 4 is a plan view illustrating the pixel circuit PC included in the pixel PX in FIG. 2. FIG. 5 is a plan view illustrating an active layer ACT included in the pixel circuit in FIG. 4. FIG. 6 is a plan view illustrating a first conductive layer 210 included in the pixel circuit in FIG. 4. FIG. 7 is a plan view illustrating a second conductive layer 220 included in the pixel circuit in FIG. 4. FIG. 8 is a plan view illustrating a third conductive layer 230 included in the pixel circuit in FIG. 4. FIG. 9 is a plan view illustrating a fourth conductive layer 240 included in the pixel circuit in FIG. 4. FIG. 10 is a cross-sectional view taken along a line X-X' in FIG. 4.

Referring to FIGS. 4, 5, 6, 7, 8, 9, and 10, the pixel circuit PC may include an active layer ACT, a first conductive layer 210, and a second conductive layer 220, a third conductive layer 230, and a fourth conductive layer 240. The light emitting diode LD may include the anode ANO, an emission layer EML, and the cathode CAT.

The active layer ACT may be disposed on a substrate SUB. The substrate SUB may include glass, quartz, metal, polyimide (PI), or the like. In an embodiment, a buffer layer BUF may be disposed between the substrate SUB and the active layer ACT. The buffer layer BUF may include an inorganic insulation material such as silicon oxide, silicon nitride, silicon oxynitride, or the like.

The active layer ACT may include polycrystalline silicon. The active layer ACT may include a first source region S1, a first drain region D1, a first channel region C1, a second source region S2, a second drain region D2, a second channel region C2, a first sub-source region S3-1, a first sub-drain region D3-1, a first sub-channel region C3-1, a second sub-source region S3-2, a second sub-drain region D3-2, a second sub-channel region C3-2, a third sub-source region S4-1, a third sub-drain region D4-1, a third sub-channel region C4-1, a fourth sub-source region S4-2, a fourth sub-drain region D4-2, a fourth sub-channel region C4-2, a fifth source region S5, a fifth drain region D5, a fifth channel region C5, a sixth source region S6, a sixth drain region D6, a sixth channel region C6, a seventh source region S7, a seventh drain region D7, a seventh channel region C7, an eighth source region S8, an eighth drain region D8, and an eighth channel region C8.

The first source region S1, the first drain region D1, the second source region S2, the second drain region D2, the first sub-source region S3-1, the first sub-drain region D3-1, the second sub-source region S3-2, the second sub-drain region D3-2, the third sub-source region S4-1, the third sub-drain region D4-1, the fourth sub-source region S4-2, the fourth sub-drain region D4-2, the fifth source region S5, the fifth drain region D5, the sixth source region S6, the sixth drain region D6, the seventh source region S7, the seventh drain region D7, the eighth source region S8, and the eighth drain region D8 may function as the first source electrode S1, the first drain electrode D1, the second source electrode S2, the second drain electrode D2, the first sub-source electrode S3-1, the first sub-drain electrode D3-1, the second sub-source electrode S3-2, the second sub-drain electrode D3-2, the third sub-source electrode S4-1, the third sub-drain electrode D4-1, the fourth sub-source electrode S4-2, the fourth sub-drain electrode D4-2, the fifth source electrode S5, the fifth drain electrode D5, the sixth source electrode S6, the sixth drain electrode D6, the seventh source electrode S7, the seventh drain electrode D7, the eighth source electrode S8, and the eighth drain electrode D8, respectively. The first channel region C1 may be disposed between the first source region S1 and the first drain region D1, and the second channel region C2 may be disposed between the second source region S2 and the second drain region D2. The first sub-channel region C3-1 may be disposed between the first sub-source region S3-1 and the first sub-drain region D3-1, and the second sub-channel region C3-2 may be disposed between the second sub-source region S3-2 and the second sub-drain region D3-2. The third sub-channel region C4-1 may be disposed between the third sub-source region S4-1 and the third sub-drain region D4-1, and the fourth sub-channel region C4-2 may be disposed between the fourth sub-source region S4-2 and the fourth sub-drain region D4-2. The fifth channel region C5 may be disposed between the fifth source region S5 and the fifth drain region D5, and the sixth channel region C6 may be disposed between the sixth source region S6 and the sixth drain region D6. The seventh channel region C7 may be disposed between the seventh source region S7 and the seventh drain region D7, and the eighth channel region C8 may be disposed between the eighth source region S8 and the eighth drain region D8.

The first source region S1, the first drain region D1, the second source region S2, the second drain region D2, the first sub-source region S3-1, the first sub-drain region D3-1, the second sub-source region S3-2, the second sub-drain region D3-2, the third sub-source region S4-1, the third sub-drain region D4-1, the fourth sub-source region S4-2, the fourth sub-drain region D4-2, the fifth source region S5, the fifth drain region D5, the sixth source region S6, the sixth drain region D6, the seventh source region S7, the seventh drain region D7, the eighth source region S8, and the eighth drain region D8 may be doped with impurities. In an embodiment, the first source region S1, the first drain region D1, the second source region S2, the second drain region D2, the first sub-source region S3-1, the first sub-drain region D3-1, the second sub-source region S3-2, the second sub-drain region D3-2, the third sub-source region S4-1, the third sub-drain region D4-1, the fourth sub-source region S4-2, the fourth sub-drain region D4-2, the fifth source region S5, the fifth drain region D5, the sixth source region S6, the sixth drain region D6, the seventh source region S7, the seventh drain region D7, the eighth source region S8, and the eighth drain region D8 may be doped with P-type impurities. The first channel region C1, the second channel region C2, the first sub-channel region C3-1, the second sub-channel region C3-2, the third sub-channel region C4-1, the fourth sub-channel region C4-2, the fifth channel region C5, the sixth channel region C6, the seventh channel region C7, and the eighth channel region C8 may not be doped with impurities.

The first conductive layer 210 may be disposed on the active layer ACT. The first conductive layer 210 may include a conductive material such as molybdenum (Mo), copper (Cu), aluminum (Al), titanium (Ti), or the like. A first insulation layer 211 may be disposed between the active layer ACT and the first conductive layer 210. The first insulation layer 211 may include an inorganic insulation material such as silicon oxide, silicon nitride, silicon oxynitride, or the like.

The first conductive layer 210 may include the first gate electrode G1, the second gate electrode G2, a third gate electrode G3, a fourth gate electrode G4, the emission control line EML, and the fourth gate line GBL. The first gate electrode G1 may overlap the first channel region C1 in the plan view. The first source region S1, the first drain region D1, the first channel region C1, and the first gate electrode G1 may form the first transistor T1. The second gate electrode G2 may overlap the second channel region C2 in the plan view. The second source region S2, the second drain region D2, the second channel region C2, and the second gate electrode G2 may form the second transistor T2.

The third gate electrode G3 may include the first sub-gate electrode G3-1 and the second sub-gate electrode G3-2. The first sub-gate electrode G3-1 may overlap the first sub-channel region C3-1 in the plan view. The first sub-source region S3-1, the first sub-drain region D3-1, the first sub-channel region C3-1, and the first sub-gate electrode G3-1 may form the first sub-transistor T3-1. The second sub-gate electrode G3-2 may overlap the second sub-channel region C3-2 in the plan view. The second sub-source region S3-2, the second sub-drain region D3-2, the second sub-channel region C3-2, and the second sub-gate electrode G3-2 may form the second sub-transistor T3-2.

The fourth gate electrode G4 may include the third sub-gate electrode G4-1 and the fourth sub-gate electrode G4-2. The third sub-gate electrode G4-1 may overlap the third sub-channel region C4-1 in the plan view. The third sub-source region S4-1, the third sub-drain region D4-1, the third sub-channel region C4-1, and the third sub-gate electrode G4-1 may form the third sub-transistor T4-1. The fourth sub-gate electrode G4-2 may overlap the fourth sub-channel region C4-2 in the plan view. The fourth sub-source region S4-2, the fourth sub-drain region D4-2, the fourth sub-channel region C4-2, and the fourth sub-gate electrode G4-2 may form the fourth sub-transistor T4-2.

The emission control line EML may transmit the emission control signal EM. The emission control line EML may extend in a first direction DR1. The emission control line EML may include the fifth gate electrode G5 and the sixth gate electrode G6. The fifth gate electrode G5 may overlap the fifth channel region C5 in the plan view. The fifth source region S5, the fifth drain region D5, the fifth channel region C5, and the fifth gate electrode G5 may form the fifth transistor T5. The sixth gate electrode G6 may overlap the sixth channel region C6 in the plan view. The sixth source region S6, the sixth drain region D6, the sixth channel region C6, and the sixth gate electrode G6 may form the sixth transistor T6.

The fourth gate line GBL may transmit the fourth gate signal GB. The fourth gate line GBL may extend in the first direction DR1. The fourth gate line GBL may include the seventh gate electrode G7 and the eighth gate electrode G8. The seventh gate electrode G7 may overlap the seventh channel region C7 in the plan view. The seventh source region S7, the seventh drain region D7, the seventh channel region C7, and the seventh gate electrode G7 may form the seventh transistor T7. The eighth gate electrode G8 may overlap the eighth channel region C8 in the plan view. The eighth source region S8, the eighth drain region D8, the eighth channel region C8, and the eighth gate electrode G8 may form the eighth transistor T8.

The second conductive layer 220 may be disposed on the first conductive layer 210. The second conductive layer 220 may include a conductive material such as molybdenum (Mo), copper (Cu), aluminum (Al), titanium (Ti), or the like. A second insulation layer 212 may be disposed between the first conductive layer 210 and the second conductive layer 220. The second insulation layer 212 may include an inorganic insulation material such as silicon oxide, silicon nitride, silicon oxynitride, or the like.

The second conductive layer 220 may include a storage line RL. The storage line RL may extend in the first direction DR1. The storage line RL may overlaps the first gate electrode G1, the first sub-drain region D3-1, the second sub-source region S3-2, the third sub-drain region D4-1, and the fourth sub-source region S4-2 in the plan view. The first gate electrode G1 and the storage line RL may form the storage capacitor CST.

A first opening OP1, a second opening OP2, and a third opening OP3 may be defined in the storage line RL. The first opening OP1 may be formed in an area overlapping the first sub-drain region D3-1 and the second sub-source region S3-2 in the plan view. The second opening OP2 may be formed in an area overlapping the third sub-drain region D4-1 and the fourth sub-source region S4-2 in the plan view. The third opening OP3 may be formed in an area overlapping the first gate electrode G1 in the plan view.

The third conductive layer 230 may be disposed on the second conductive layer 220. The third conductive layer 230 may include a conductive material such as molybdenum (Mo), copper (Cu), aluminum (Al), titanium (Ti), or the like. A third insulation layer 213 may be disposed between the second conductive layer 220 and the third conductive layer 230. The third insulation layer 213 may include an inorganic insulation material such as silicon oxide, silicon nitride, silicon oxynitride, or the like.

The third conductive layer 230 may include a connection line CNL, the first gate line GWL, the second gate line GCL, the third gate line GIL, a first connection pattern CP1, a second connection pattern CP2, a third connection pattern CP3, a fourth connection pattern CP4, the first initialization voltage line VINTL1, the second initialization voltage line VINTL2, the bias voltage line VBIASL, a first hold pattern HP1, and a second hold pattern HP2.

The connection line CNL may connect the fifth source region S5 and the storage line RL. The connection line CNL may contact the fifth source region S5 through a ninth contact hole CH9 defined in the first insulation layer 211, the second insulation layer 212, and the third insulation layer 213, and may contact the storage line RL through an eighth contact hole CH8 defined in the third insulation layer 213. The connection line CNL may extend in the first direction DR1.

The first gate line GWL may transmit the first gate signal GW. The first gate line GWL may contact the second gate electrode G2 through a third contact hole CH3 defined in the second insulation layer 212 and the third insulation layer 213. The first gate line GWL may extend in the first direction DR1.

The second gate line GCL may transmit the second gate signal GC. The second gate line GCL may contact the third gate electrode G3 through a fourth contact hole CH4 defined in the second insulation layer 212 and the third insulation layer 213. The second gate line GCL may extend in the first direction DR1.

The third gate line GIL may transmit the third gate signal GI. The third gate line GIL may contact the fourth gate electrode G4 through a fifth contact hole CH5 defined in the second insulation layer 212 and the third insulation layer 213. The third gate line GIL may extend in the first direction DR1.

The first connection pattern CP1 may connect the second sub-drain region D3-2 and the fourth sub-drain region D4-2 to the first gate electrode G1. The first connection pattern CP1 may contact the second sub-drain region D3-2 and the fourth sub-drain region D4-2 through an eleventh contact hole CH11 defined in the first insulation layer 211, the second insulation layer 212, and the third insulation layer 213, and may contact the gate electrode G1 through a tenth contact hole CH10 defined in the second insulation layer 212 and the third insulation layer 213. The tenth contact hole CH10 may be disposed inside of the third opening OP3 in the plan view.

The second connection pattern CP2 may be connected to the second source region S2. The second connection pattern CP2 may contact the second source region S2 through a twelfth contact hole CH12 defined in the first insulation layer 211, the second insulation layer 212, and the third insulation layer 213.

The third connection pattern CP3 may be connected to the sixth drain region D6 and the seventh drain region D7. The third connection pattern CP3 may contact the sixth drain region D6 and the seventh drain region D7 through a thirteenth contact hole CH13 defined in the first insulation layer 211, the second insulation layer 212, and the third insulation layer 213.

The fourth connection pattern CP4 may connect the first source region S1 and the eighth drain region D8. The fourth connection pattern CP4 may contact the first source region S1 through a fourteenth contact hole CH14 defined in the first insulation layer 211, the second insulation layer 212, and the third insulation layer 213, and may contact the eighth drain region D8 through a fifteenth contact hole CH15 defined in the first insulation layer 211, the second insulation layer 212, and the third insulation layer 213.

The first initialization voltage line VINTL1 may transmit the first initialization voltage VINT1. The first initialization voltage line VINTL1 may contact the third sub-source region S4-1 through a contact hole CH20 defined in the first insulation layer 211, the second insulation layer 212, and the third insulation layer 213. The first initialization voltage line VINTL1 may extend in the first direction DR1.

The second initialization voltage line VINTL2 may transmit the second initialization voltage VINT2. The second initialization voltage line VINTL2 may contact the seventh source region S7 through a sixth contact hole CH6 defined in the first insulation layer 211, the second insulation layer 212, and the third insulation layer 213. The second initialization voltage line VINTL2 may extend in the first direction DR1.

The bias voltage line VBIASL may transmit the bias voltage VBIAS. The bias voltage line VBIASL may contact the eighth source region S8 through a seventh contact hole CH7 defined in the first insulation layer 211, the second insulation layer 212, and the third insulation layer 213. The bias voltage line VBIASL may extend in the first direction DR1.

The first hold pattern HP1 may overlap the first sub-drain region D3-1, the second sub-source region S3-2, and the storage line RL in the plan view. The first hold pattern HP1 may be connected to the first sub-drain region D3-1 and the second sub-source region S3-2. The first hold pattern HP1 may contact the first sub-drain region D3-1 and the second sub-source region S3-2 through a first contact hole CH1 defined in the first insulation layer 211, the second insulation layer 212, and the third insulation layer 213. The first contact hole CH1 may be disposed inside of the first opening OP1 in the plan view.

The second hold pattern HP2 may overlap the third sub-drain region D4-1, the fourth sub-source region S4-2, and the storage line RL in the plan view. The second hold pattern HP2 may be connected to the third sub-drain region D4-1 and the fourth sub-source region S4-2. The second hold pattern HP2 may contact the third sub-drain region D4-1 and the fourth sub-source region S4-2 through a second contact hole CH2 defined in the first insulation layer 211, the second insulation layer 212, and the third insulation layer 213. The second contact hole CH2 may be disposed inside of the second opening OP2 in the plan view.

The fourth conductive layer 240 may be disposed on the third conductive layer 230. The fourth conductive layer 240 may include a conductive material such as molybdenum (Mo), copper (Cu), aluminum (Al), titanium (Ti), or the like. A fourth insulation layer 214 may be disposed between the third conductive layer 230 and the fourth conductive layer 240. The fourth insulation layer 214 may include an inorganic insulation material such as silicon oxide, silicon nitride, silicon oxynitride, or the like.

The fourth conductive layer 240 may include the data line DL, the driving voltage line ELVDDL, and a fifth connection pattern CP5.

The data line DL may transmit the data signal DS. The data line DL may contact the second connection pattern CP2 through a sixteenth contact hole CH16 defined in the fourth insulation layer 214. The data line DL may extend in a second direction DR2. In an embodiment, the second direction DR2 may intersect the first direction DR1.

The driving voltage line ELVDDL may transmit the driving voltage ELVDD. The driving voltage line ELVDDL may contact the connection line CNL through a seventeenth contact hole CH17 defined in the fourth insulation layer 214. The driving voltage line ELVDDL may extend in the second direction DR2.

The fifth connection pattern CP5 may be connected to the third connection pattern CP3. The fifth connection pattern CP5 may contact the third connection pattern CP3 through an eighteenth contact hole CH18 defined in the fourth insulation layer 214.

The anode ANO may be disposed on the fourth conductive layer 240. The anode ANO may include a metal and/or a transparent conductive oxide. A fifth insulation layer 215 may be disposed between the fourth conductive layer 240 and the anode ANO. The fifth insulation layer 215 may include an inorganic insulation material such as silicon oxide, silicon nitride, silicon oxynitride, or the like and/or an organic insulation material such as polyimide (PI) or the like. The anode ANO may be connected to the fifth connection pattern CP5. The anode ANO may contact the fifth connection pattern CP5 through a nineteenth contact hole CH19 defined in the fifth insulation layer 215.

The sixth insulation layer 216 may be disposed on the anode ANO. The sixth insulation layer 216 may be a pixel defining layer which define a light emitting region of the light emitting diode LD. The sixth insulation layer 216 may include an organic insulation material such as polyimide (PI) or the like. A fourth opening OP4 exposing a central portion of the anode ANO may be defined in the sixth insulation layer 216.

The emission layer EML may be disposed on the anode ANO. The emission layer EML may be positioned in the fourth opening OP4 in the plan view. The emission layer EML may include an organic light emitting material, an inorganic light emitting material, a quantum dot, or the like.

In an embodiment, the organic light emitting material may include a low molecular weight organic compound or a high molecular weight organic compound. For example, low molecular weight organic compounds include copper phthalocyanine, N,N'-diphenylbenzidine, and tris-(8-hydroxyquinoline)aluminum, or the like, and the high molecular organic compound may include poly(3,4-ethylenedioxythiophene), polyaniline, poly-phenylenevinylene, polyfluorene, or the like.

In an embodiment, the quantum dot may include a core including a group II-VI compound, a group III-V compound, a group IV-VI compound, a group IV element, a group IV compound, and combinations thereof. In an embodiment, the quantum dot may have a core-shell structure including a core and a shell surrounding the core. The shell may serve as a protective layer for maintaining semiconductor properties by preventing chemical modification of the core and as a charging layer for imparting electrophoretic properties to the quantum dot.

The cathode CAT may be disposed on the sixth insulation layer 216 and the emission layer EML. The cathode CAT may include a metal and/or a transparent conductive oxide.

Figure 11:
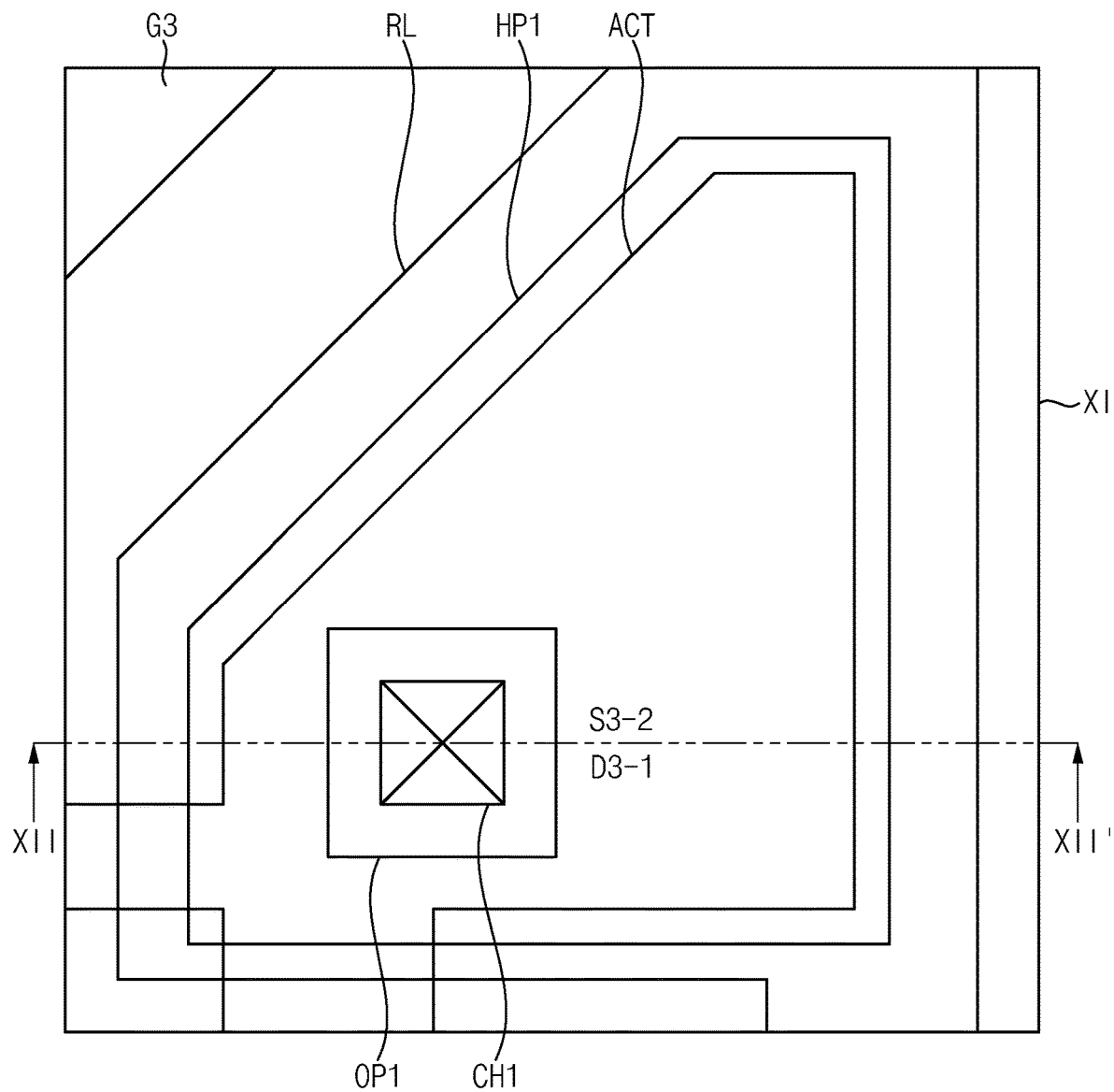
FIG. 11 is a plan view enlarging an area XI in FIG. 4.
Figure 12:
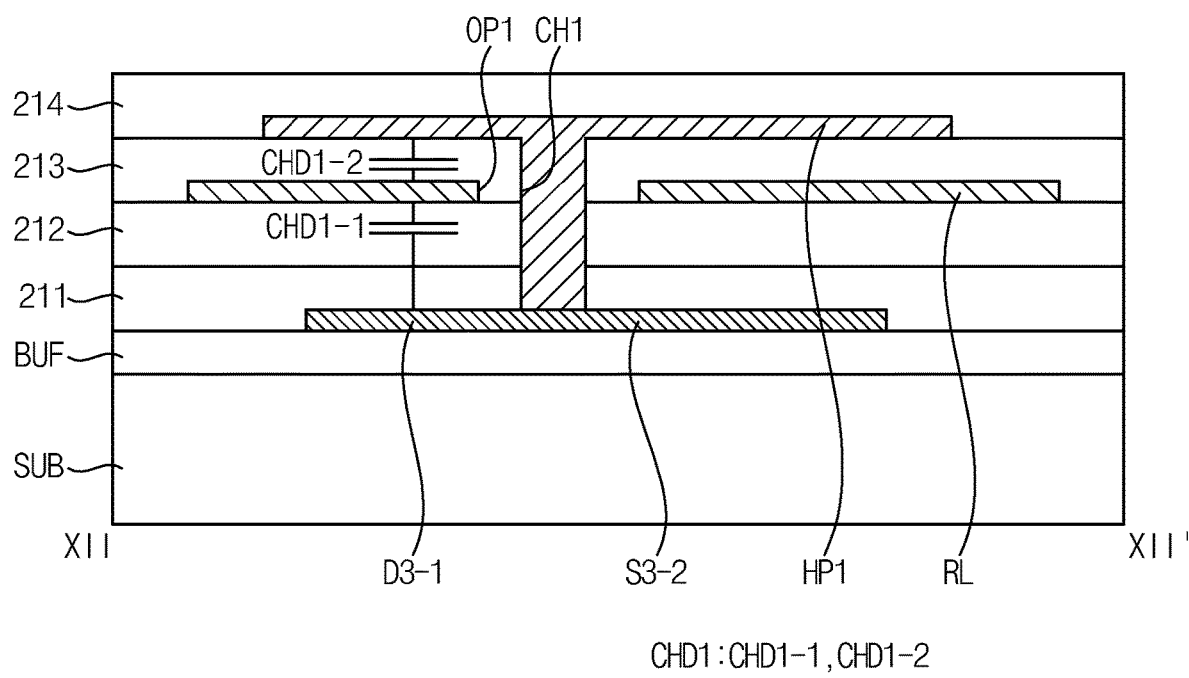
FIG. 12 is a cross-sectional view taken along a line XII-XII' in FIG. 11.

FIG. 11 is a plan view enlarging an area XI in FIG. 4. For convenience of description, illustration of the fourth conductive layer 240 is omitted in FIG. 11. FIG. 12 is a cross-sectional view taken along a line XII-XII' in FIG. 11.

Referring to FIGS. 11 and 12, the storage line RL may overlap the first sub-drain region D3-1 and the second sub-source region S3-2 of the active layer ACT in the plan view. Accordingly, a first sub-hold capacitor CHD1-1 may be formed between the storage line RL and the first sub-drain region D3-1 and the second sub-source region S3-2 of the active layer ACT.

In order to reduce a leakage current of the third transistor T3, the third transistor T3 may have a dual gate structure including the first sub-gate electrode G3-1 and the second sub-gate electrode G3-2. However, the leakage current of the third transistor T3 may increase due to an increase in a kickback voltage due to a parasitic capacitance generated between the first intermediate node NIL which is disposed between the first sub-drain region D3-1 and the second sub-source region S3-2, and the second gate line GCL. When the storage line RL overlaps the first sub-drain region D3-1 and the second sub-source region S3-2 to form the first sub-hold capacitor CHD1-1, the leakage current of the third transistor T3 may be reduced. However, since the areas of the first sub-drain region D3-1 and the second sub-source region S3-2 of the active layer ACT are small, there may be a limitation in securing sufficient capacitance between the first sub-drain region D3-1 and the second sub-source region S3-2 of the active layer ACT and the storage line RL.

The first hold pattern HP1 may overlap the first sub-drain region D3-1 and the second sub-source region S3-2 of the active layer ACT, and the storage line RL. Accordingly, a second sub-hold capacitor CHD1-2 may be formed between the first hold pattern HP1 and the storage line RL. Further, the first hold pattern HP1 may be connected to the first sub-drain region D3-1 and the second sub-source region S3-2. The first hold pattern HP1 may contact the first sub-drain region D3-1 and the second sub-source region S3-2 through the first contact hole CH1 defined in the first insulation layer 211, the second insulation layer 212, and the third insulation layer 213. The first contact hole CH1 may be disposed inside of the first opening OP1 defined in the storage line RL in the plan view. Thus, the first hold pattern HP1 may be connected to the first sub-drain region D3-1 and the second sub-source region S3-2 through the second contact hole CH2 while insulated from the storage line RL. Accordingly, a first hold capacitor CHD1 having a capacitance corresponding to the sum of a capacitance of the first sub-hold capacitor CHD1-1 and a capacitance of the second sub-hold capacitor CHD1-2 may be formed between the first sub-drain region D3-1 and the second sub-source region S3-2 of the active layer ACT, the storage line RL, and the first hold pattern HP1. In other words, the first hold capacitor CHD1 may have a double capacitor structure including the first sub-hold capacitor CHD1-1 and the second sub-hold capacitor CHD1-2. Accordingly, a sufficient capacitance may be secured between the first sub-drain region D3-1 and the second sub-source region S3-2 of the active layer ACT and the storage line RL, and the leakage current of the third transistor T3 may be reduced. Accordingly, when the display device 100 is driven at a low frequency, flicker due to the leakage current of the third transistor T3 may not occur, and display quality of the display device 100 may be improved.

Figure 13:
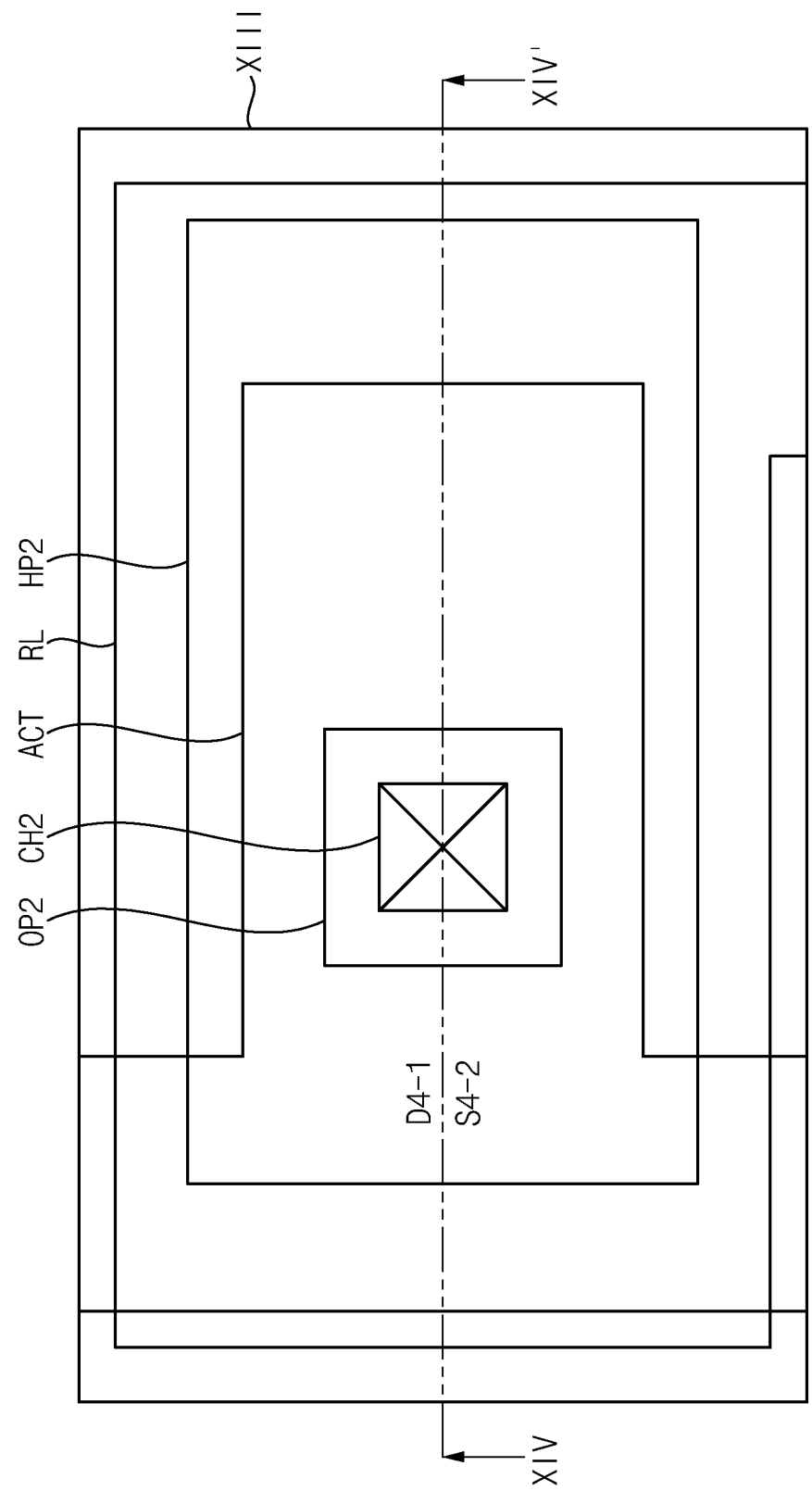
FIG. 13 is a plan view enlarging an area XIII in FIG. 4.
Figure 14:
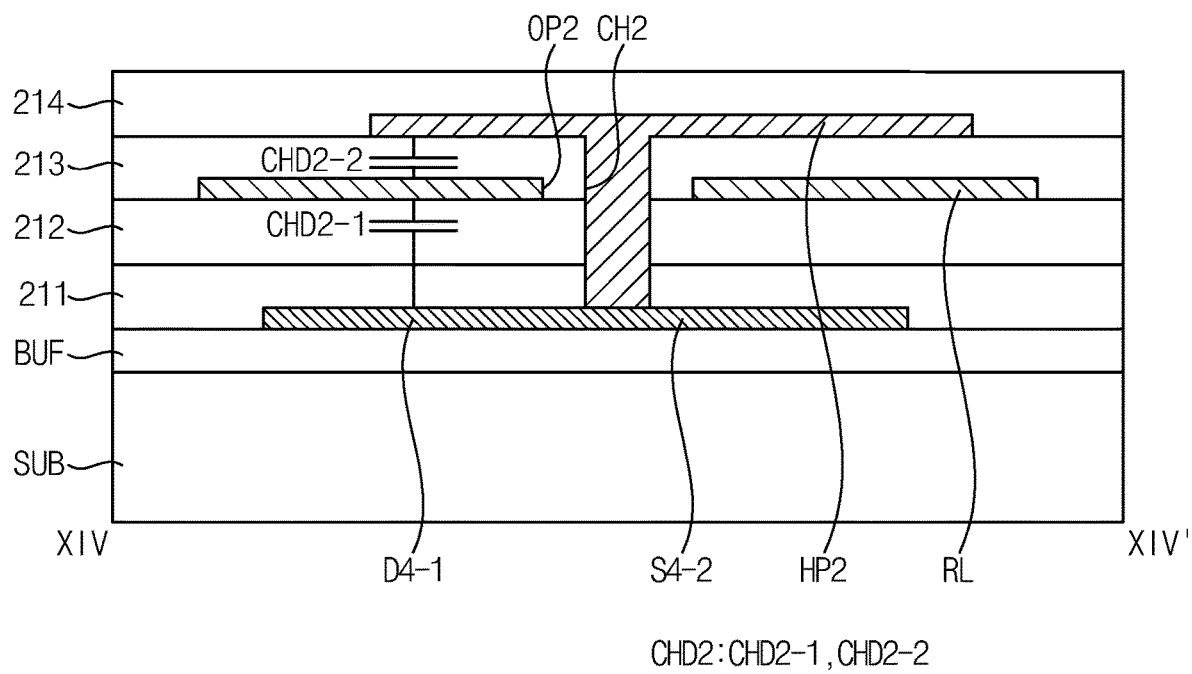
FIG. 14 is a cross-sectional view taken along a line XIV-XIV' in FIG. 13.

FIG. 13 is a plan view enlarging an area XIII in FIG. 4. For convenience of description, illustration of the fourth conductive layer 240 is omitted in FIG. 13. FIG. 14 is a cross-sectional view taken along a line XIV-XIV' in FIG. 13.

Referring to FIGS. 13 and 14, the storage line RL may overlap the third sub-drain region D4-1 and the fourth sub-source region S4-2 of the active layer ACT in the plan view. Accordingly, a third sub-hold capacitor CHD2-1 may be formed between the storage line RL and the third sub-drain region D4-1 and the fourth sub-source region S4-2 of the active layer ACT.

In order to reduce a leakage current of the fourth transistor T4, the fourth transistor T4 may have a dual gate structure including the third sub-gate electrode G4-1 and the fourth sub-gate electrode G4-2. However, the leakage current of the fourth transistor T4 may increase due to an increase in a kickback voltage due to a parasitic capacitance generated between the second intermediate node NI2, which is disposed between the third sub-drain region D4-1 and the fourth sub-source region S4-2, and the third gate line GIL. When the storage line RL overlaps the third sub-drain region D4-1 and the fourth sub-source region S4-2 to form the third sub-hold capacitor CHD2-1, the leakage current of the fourth transistor T4 may be reduced. However, since the areas of the third sub-drain region D4-1 and the fourth sub-source region S4-2 of the active layer ACT are small, there may be a limitation in securing sufficient capacitance between the third sub-drain region D4-1 and the fourth sub-source region S4-2 of the active layer ACT and the storage line RL.

The second hold pattern HP2 may overlap the third sub-drain region D4-1 and the fourth sub-source region S4-2 of the active layer ACT, and the storage line RL. Accordingly, a fourth sub-hold capacitor CHD2-2 may be formed between the second hold pattern HP2 and the storage line RL. Further, the second hold pattern HP2 may be connected to the third sub-drain region D4-1 and the fourth sub-source region S4-2. The second hold pattern HP2 may contact the third sub-drain region D4-1 and the fourth sub-source region S4-2 through the second contact hole CH2 defined in the first insulation layer 211, the second insulation layer 212, and the third insulation layer 213. The second contact hole CH2 may be disposed inside of the second opening OP2 defined in the storage line RL in the plan view. Thus, the second hold pattern HP2 may be connected to the first sub-drain region D3-1 and the second sub-source region S3-2 through the second contact hole CH2 while insulated from the storage line RL. Accordingly, a second hold capacitor CHD2 having a capacitance corresponding to the sum of a capacitance of the third sub-hold capacitor CHD2-1 and a capacitance of the fourth sub-hold capacitor CHD2-2 may be formed between the third sub-drain region D4-1 and the fourth sub-source region S4-2 of the active layer ACT, the storage line RL, and the second hold pattern HP2. In other words, the second hold capacitor CHD2 may have a double capacitor structure including the third sub-hold capacitor CHD2-1 and the fourth sub-hold capacitor CHD2-2. Accordingly, a sufficient capacitance may be secured between the third sub-drain region D4-1 and the fourth sub-source region S4-2 of the active layer ACT and the storage line RL, and the leakage current of the fourth transistor T4 may be reduced. Accordingly, when the display device 100 is driven at a low frequency, flicker due to the leakage current of the fourth transistor T4 may not occur, and display quality of the display device 100 may be improved.

The display device according to the embodiments may be applied to a display device included in a computer, a notebook, a mobile phone, a smart phone, a smart pad, a PMP, a PDA, an MP3 player, or the like.

Although the display devices and the pixels according to the embodiments have been described with reference to the drawings, the illustrated embodiments are examples, and may be modified and changed by a person having ordinary knowledge in the relevant technical field without departing from the technical spirit described in the following claims.

What is claimed is:

1. A pixel, comprising:
   a light emitting diode which includes an anode and a cathode;
   a first transistor which includes a first source region electrically connected to a driving voltage line that transmits a driving voltage, a first drain region electrically connected to the anode, a first channel region disposed between the first source region and the first drain region, and a first gate electrode overlapping the first channel region;
   a first sub-transistor which includes a first sub-source region connected to the first drain region, a first sub-drain region, a first sub-channel region disposed between the first sub-source region and the first sub-drain region, and a first sub-gate electrode overlapping the first sub-channel region;
   a second sub-transistor which includes a second sub-source region connected to the first sub-drain region, a second sub-drain region connected to the first gate electrode, a second sub-channel region disposed between the second sub-source region and the second sub-drain region, and a second sub-gate electrode overlapping the second sub-channel region;
   a storage line which overlaps the first sub-drain region and the second sub-source region in a plan view; and
   a first hold pattern which overlaps the first sub-drain region, the second sub-source region, and the storage line in the plan view, and connected to the first sub-drain region and the second sub-source region.

2. The pixel of claim 1, further comprising:
   a connection pattern which connects the first gate electrode and the second sub-drain region, and disposed in a different layer from the first gate electrode.

3. The pixel of claim 2, wherein the first hold pattern is disposed in a same layer as the connection pattern.

4. The pixel of claim 1, wherein the storage line is disposed in a different layer from the first gate electrode and overlaps the first gate electrode in the plan view.

5. The pixel of claim 1, wherein the storage line receives the driving voltage.

6. The pixel of claim 1, wherein the storage line is disposed on the first sub-drain region and the second sub-source region, and
   wherein the first hold pattern is disposed on the storage line.

7. The pixel of claim 6, wherein the first hold pattern contacts the first sub-drain region and the second sub-source region through a contact hole defined in an insulation layer disposed between the first sub-drain region and the first hold pattern and between the second sub-source region and the first hold pattern.

8. The pixel of claim 7, wherein an opening is defined in the storage line, and
   wherein the contact hole is positioned in the opening in the plan view.

9. The pixel of claim 1, further comprising:
   a third sub-transistor which includes a third sub-source region electrically connected to an initialization voltage line that transmits an initialization voltage, a third sub-drain region, a third sub-channel region disposed between the third sub-source region and the third sub-drain region, and a third sub-gate electrode overlapping the third sub-channel region;

a fourth sub-transistor which includes a fourth sub-source region connected to the third sub-drain region, a fourth sub-drain region connected to the first gate electrode, a fourth sub-channel region disposed between the fourth sub-source region and the fourth sub-drain region, and a fourth sub-gate electrode overlapping the fourth sub-channel region; and a second hold pattern which overlaps the third sub-drain region and the fourth sub-source region in the plan view, and connected to the third sub-drain region and the fourth sub-source region, wherein the storage line overlaps the third sub-drain region, the fourth sub-source region, and the second hold pattern in the plan view.

10. The pixel of claim 9, wherein the second hold pattern is disposed in a same layer as the first hold pattern.

11. A pixel, comprising:
a light emitting diode which includes an anode and a cathode;
a first transistor which includes a first source region electrically connected to a driving voltage line that transmits a driving voltage, a first drain region electrically connected to the anode, a first channel region disposed between the first source region and the first drain region, and a first gate electrode overlapping the first channel region;
a third sub-transistor which includes a third sub-source region electrically connected to an initialization voltage line that transmits an initialization voltage, a third sub-drain region, a third sub-channel region disposed between the third sub-source region and the third sub-drain region, and a third sub-gate electrode overlapping the third sub-channel region;
a fourth sub-transistor which includes a fourth sub-source region connected to the third sub-drain region, a fourth sub-drain region connected to the first gate electrode, a fourth sub-channel region disposed between the fourth sub-source region and the fourth sub-drain region, and a fourth sub-gate electrode overlapping the fourth sub-channel region;
a storage line which overlaps the third sub-drain region and the fourth sub-source region in a plan view; and
a second hold pattern which overlaps the third sub-drain region, the fourth sub-source region, and the storage line in the plan view, and connected to the third sub-drain region and the fourth sub-source region.

12. The pixel of claim 11, wherein the second hold pattern is disposed in a same layer as the initialization voltage line.

13. The pixel of claim 11, wherein the storage line is disposed in a different layer from the first gate electrode and overlaps the first gate electrode in the plan view.

14. The pixel of claim 11, wherein the storage line receives the driving voltage.

15. The pixel of claim 11, wherein the storage line is disposed on the third sub-drain region and the fourth sub-source region, and
wherein the second hold pattern is disposed on the storage line.

16. The pixel of claim 15, wherein the second hold pattern contacts the third sub-drain region and the fourth sub-source region through a contact hole defined in an insulation layer disposed between the third sub-drain region and the second hold pattern and between the fourth sub-source region and the second hold pattern.

17. The pixel of claim 16, wherein an opening is defined in the storage line, and
wherein the contact hole is positioned in the opening in the plan view.

18. A display device, comprising:
a pixel which includes a light emitting diode including an anode and a cathode, and a pixel circuit providing a driving current to the light emitting diode;
a gate driver providing a gate signal to the pixel;
a data driver providing a data signal to the pixel; and
an emission control driver providing an emission control signal to the pixel,
wherein the pixel circuit includes:
a first transistor which includes a first source region electrically connected to a driving voltage line that transmits a driving voltage, a first drain region electrically connected to the anode, a first channel region disposed between the first source region and the first drain region, and a first gate electrode overlapping the first channel region;
a first sub-transistor which includes a first sub-source region connected to the first drain region, a first sub-drain region, a first sub-channel region disposed between the first sub-source region and the first sub-drain region, and a first sub-gate electrode overlapping the first sub-channel region;
a second sub-transistor which includes a second sub-source region connected to the first sub-drain region, a second sub-drain region connected to the first gate electrode, a second sub-channel region disposed between the second sub-source region and the second sub-drain region, and a second sub-gate electrode overlapping the second sub-channel region;
a storage line which overlaps the first sub-drain region and the second sub-source region in a plan view; and
a first hold pattern which overlaps the first sub-drain region, the second sub-source region, and the storage line in the plan view, and connected to the first sub-drain region and the second sub-source region.

19. The display device of claim 18, wherein the pixel circuit further includes:
a third sub-transistor which includes a third sub-source region electrically connected to an initialization voltage line that transmits an initialization voltage, a third sub-drain region, a third sub-channel region disposed between the third sub-source region and the third sub-drain region, and a third sub-gate electrode overlapping the third sub-channel region;
a fourth sub-transistor which includes a fourth sub-source region connected to the third sub-drain region, a fourth sub-drain region connected to the first gate electrode, a fourth sub-channel region disposed between the fourth sub-source region and the fourth sub-drain region, and a fourth sub-gate electrode overlapping the fourth sub-channel region; and
a second hold pattern which overlaps the third sub-drain region and the fourth sub-source region in the plan view, and connected to the third sub-drain region and the fourth sub-source region, and
wherein the storage line overlaps the third sub-drain region, the fourth sub-source region, and the second hold pattern in the plan view.

20. The display device of claim 19, wherein the second hold pattern is disposed in a same layer as the first hold pattern.

\* \* \* \* \*